United States Patent [19]
Miyano

[11] Patent Number: 6,166,669
[45] Date of Patent: Dec. 26, 2000

[54] PROTECTION FROM INBOUND SIGNAL NOISE CAUSED BY INDUCTIVELY COUPLED OUTBOUND SIGNAL TRANSITIONS BY CONTROLLING DECISION THRESHOLD

[75] Inventor: Kazutaka Miyano, Tokyo, Japan

[73] Assignee: NEC Corporation, Tokyo, Japan

[21] Appl. No.: 09/280,674

[22] Filed: Mar. 29, 1999

[30] Foreign Application Priority Data

Mar. 30, 1998 [JP] Japan ................................ 10-084135

[51] Int. Cl.⁷ ...................................................... H03M 1/00
[52] U.S. Cl. ............................. 341/132; 375/76; 361/11; 367/76
[58] Field of Search ............................ 341/132; 326/27, 326/30; 327/310, 312; 375/346, 76; 342/350; 333/12; 361/11

[56] References Cited

U.S. PATENT DOCUMENTS

| 4,663,744 | 5/1987 | Russell et al. | 367/76 |
| 4,821,292 | 4/1989 | Childress | 375/76 |
| 5,784,241 | 7/1998 | Munch et al. | 361/111 |

*Primary Examiner*—Brain Young
*Assistant Examiner*—John B Nguyen
*Attorney, Agent, or Firm*—Suhgrue, Mion, Zinn, Macpeak & Seas, PLLC

[57] ABSTRACT

A noise-immune electronic circuit includes an input circuit for receiving an inbound signal through an input transmission line and comparing the inbound signal with a decision threshold to produce input data of the electronic circuit having one of predefined discrete levels depending on relative magnitudes of the inbound signal and the decision threshold and an output circuit for receiving output data of the electronic circuit and producing therefrom an outbound signal and forwarding the outbound signal onto an output transmission line. The input and output transmission lines are inductively coupled together so that a noise is introduced to the received inbound signal when a voltage transition occurs in the forwarded outbound signal. To avoid decision errors of the input circuit, a noise protection circuit is provided, which is responsive to a voltage transition of the output data of the electronic circuit for controlling the decision threshold at timing coincident with the noise produced in the inbound signal so that the input circuit makes no decision errors in the presence of the noise.

10 Claims, 4 Drawing Sheets

ADJUSTABLE DELAY CIRCUIT

6,166,669

PROTECTION FROM INBOUND SIGNAL NOISE CAUSED BY INDUCTIVELY COUPLED OUTBOUND SIGNAL TRANSITIONS BY CONTROLLING DECISION THRESHOLD

BACKGROUND OF THE INVENTION

1. Field of the Invention

The present invention relates generally to noise protection circuits, and more specifically to a circuit arrangement where noise-affected inbound signals received from a transmission medium are compared with a decision threshold to determine their logical level before processing the signals.

2. Description of the Related Art

Electromagnetic shielding of conductors is the usual technique for protecting integrated circuits from interference if the conductors are exposed to noisy environment. Care is also exercised to provide sufficient separations between such conductors and potential sources of noise. However, recent tendency toward high-density integration and layout and high transmission speed makes the current noise protection scheme ineffectual.

Particularly, in an integrated circuit where an inbound signal is received over a transmission medium, a noise is introduced to the received signal by electromagnetic coupling from an adjacent transmission medium when there is a transition in an outbound signal transmitted through it. As specifically shown in FIG. 1, such an integrated circuit includes a processing circuit 10 which receives input data from an input circuit 11 and forwards the result of processing as output data to an output circuit 12. The inbound signal of the integrated circuit is received over an input line 13 and supplied to the input circuit 11, which is essentially comprised of a comparator 14. Comparator 14 is enabled in response to a sampling pulse from the processor 10 to compare the received signal with a reference potential, or decision threshold that is supplied via an electromagnetically shielded conductor 15. Depending on the relative voltages of the input signals, the comparator 14 determines the voltage level of the inbound signal and produces an output as input data of the integrated circuit. This input data is supplied to the processing circuit and latched. The output data from the processor 10 is amplified through data buffers 16 and 17 of the output circuit 12 and forwarded onto an output line 18 as an outbound signal.

The input and output lines 13 and 18 are inductively coupled together by parasitic mutual inductance. As a result of this inductive coupling, a noise 20 is introduced to the inbound signal, as illustrated in FIG. 2, when the forwarded outbound signal changes its level. If the voltage transition of the outbound signal occurs when the inbound signal is low and its direction is upward as indicated by numeral 20 in FIG. 2, a voltage hump, or noise 21 would be introduced to the low-level inbound signal. If the noise level is higher than the reference potential and coincides with a sampling pulse 22, the comparator 14 detects the noise as a high-level input and produces a false output. Similarly, if the voltage transition of the outbound signal occurs when the inbound signal is high and its direction is downward as indicated by numeral 23 in FIG. 2, a voltage drop, or noise 24 would be introduced to the high-level inbound signal. If the high-level inbound signal drops to a level lower than the reference potential and coincides with a sampling pulse 25, the comparator 14 will detect this noise as a low-level input and produces a false output.

If the sampling pulse is out of timing with respect to the noise as indicated by a pulse 26, the comparator produces no false output. However, since the sampling pulses are not synchronized with the output data, the comparator 14 produces decision errors with a high likelihood of occurrence.

SUMMARY OF THE INVENTION

It is therefore an object of the present invention to protect electronic circuitry from noise introduced to an inbound signal in response to a voltage transition of an outbound signal due to inductive coupling between transmission mediums.

According to the present invention, there is provided an electronic circuit comprising an input circuit for receiving an inbound signal through an input transmission medium and comparing the inbound signal with a decision threshold to produce input data of the electronic circuit having one of predefined discrete levels depending on relative magnitudes of the inbound signal and the decision threshold and an output circuit for receiving output data of the electronic circuit and producing therefrom an outbound signal and forwarding the outbound signal onto an output transmission medium, the input and output transmission mediums being electromagnetically coupled together so that a noise is introduced to the received inbound signal when a voltage transition occurs in the forwarded outbound signal. To avoid decision errors of the input circuit, a noise protection circuit is provided. This circuit is responsive to a voltage transition of the output data of the electronic circuit for controlling the decision threshold at timing coincident with the noise produced in the inbound signal so that the input circuit makes no decision error on said noise.

BRIEF DESCRIPTION OF THE DRAWINGS

The present invention will be described in further detail with reference to the accompanying drawings, in which.

DETAILED DESCRIPTION

Figure 1:
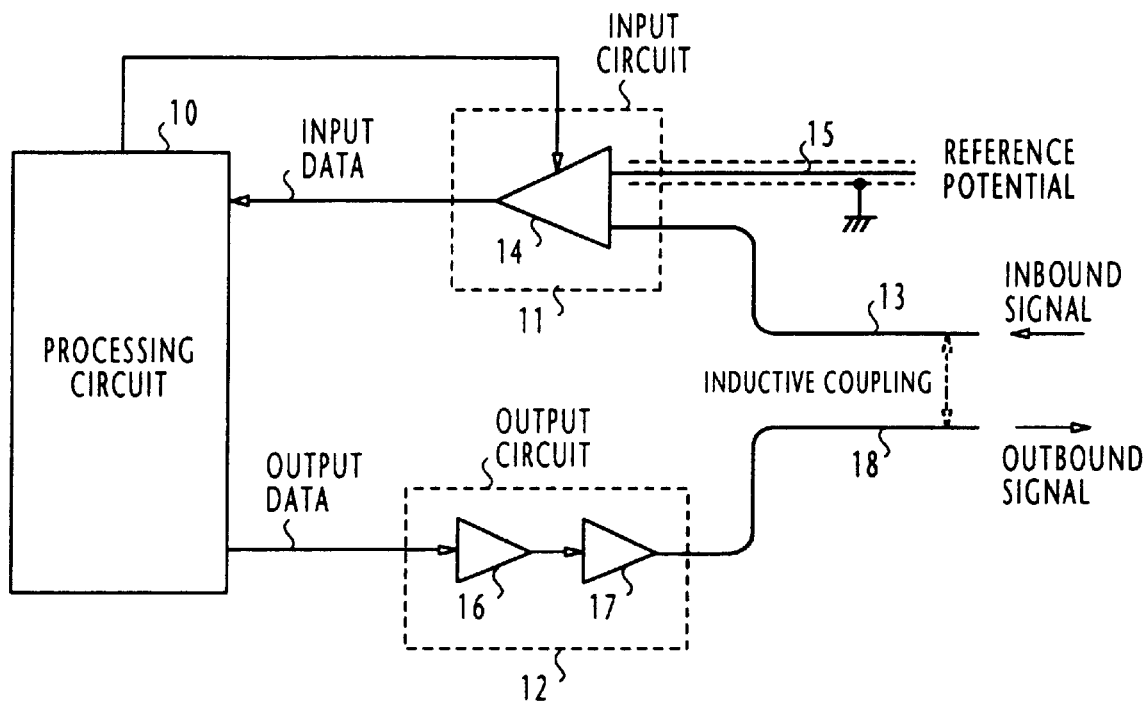
FIG. 1 is a block diagram of a prior art electronic circuit such as integrated circuit.
Figure 2:
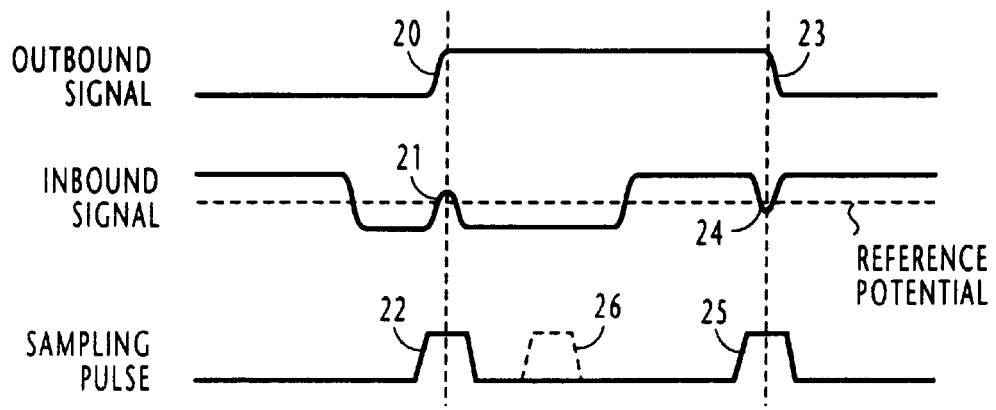
FIG. 2 is a timing diagram associated with FIG. 1.
Figure 3:
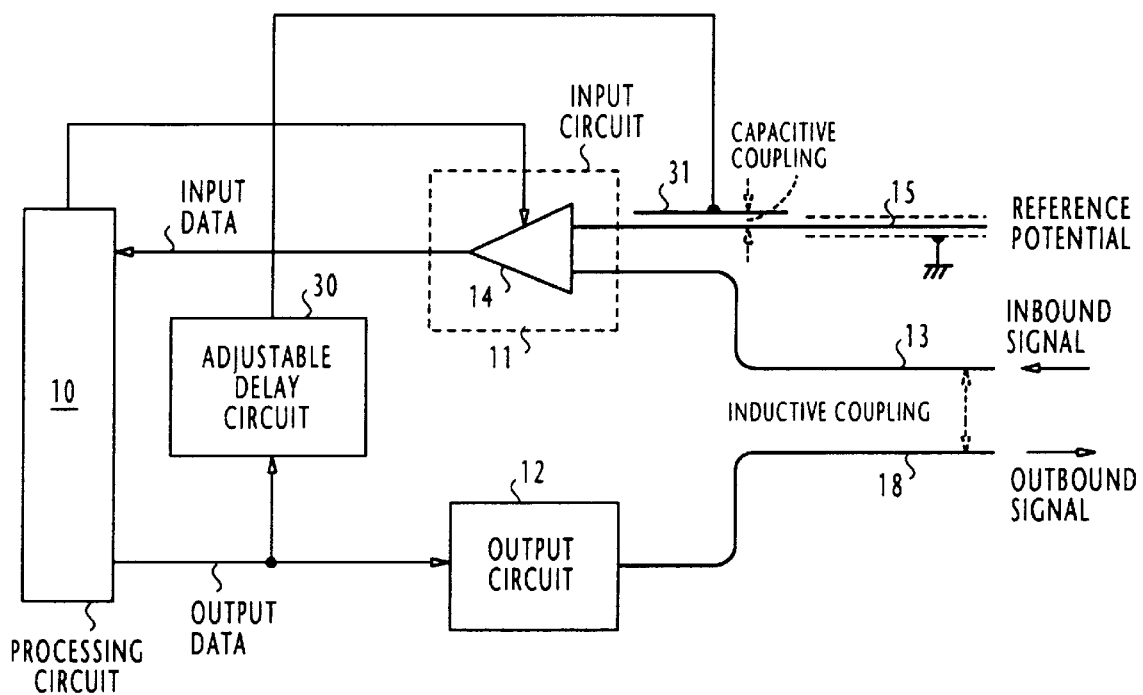
FIG. 3 is a block diagram of an electronic circuit according to one embodiment of the present invention.

Referring to FIG. 3, there is shown a noise-immune integrated circuit according to one embodiment of the present invention. The present invention differs from the prior art by the inclusion of a noise protection circuit which controls the decision threshold to prevent the input circuit from making a decision error on the input noise. This noise protection circuit is formed with an adjustable delay circuit 30 and a transient circuit element, or conductor 31 which is capacitively coupled to the shielded reference line 15. Delay circuit 30 is connected to the output of the processing circuit 10 to produce a replica of output data that is adjustably delayed with respect to the original output data. The output of the delay circuit 30 is applied to the conductor 31. Because of the capacitive coupling between conductors 31 and reference line 15, a voltage variation, or pseudo-noise occurs in the reference potential (decision threshold).

Figure 4:
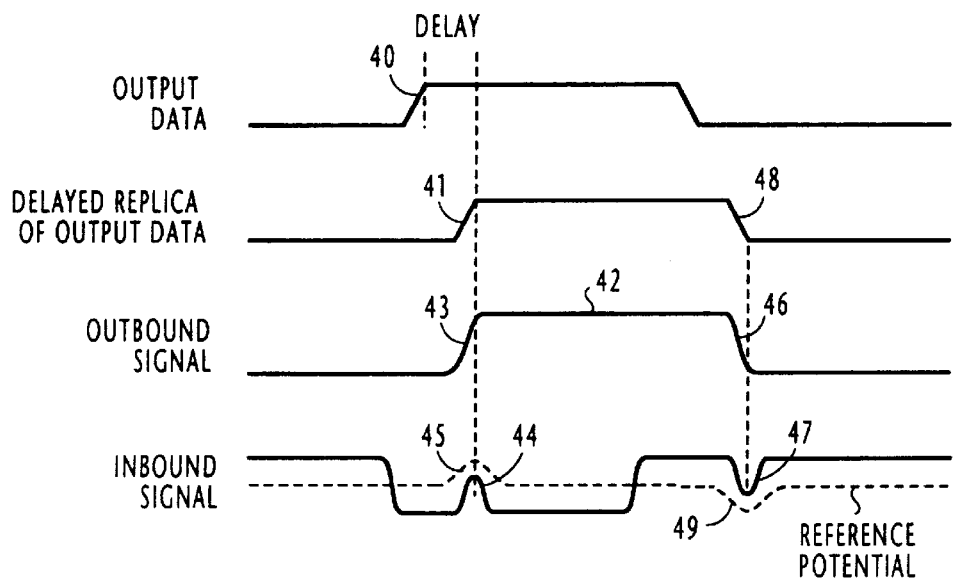
FIG. 4 is a timing diagram associated with FIG. 3.

If the voltage transition of the output data from processing circuit 10 is a rising edge 40 as shown in FIG. 4, the output of the delay circuit 30 has a corresponding voltage transition 41 adjustably delayed with respect to the rising edge 40. In this case, the pseudo-noise introduced to the reference potential is a positive hump 45.

The output of processing circuit 10, on the other hand, is amplified and forwarded from the output circuit 12 onto the output transmission medium 18 as an outbound signal 42. The amount of delay introduced by the delay circuit 30 is such that the delayed voltage transition 41 coincides with a corresponding voltage transition 43 of the outbound signal 42.

As a result of the inductive coupling between transmission mediums 1 3 and 18, the rising edge 43 of the outbound signal causes a voltage hump, or noise 44 to be introduced to a low-level inbound signal. It will be seen that the reference potential, i.e., the decision threshold of the input circuit 11, is increased by the pseudo-noise 45 to a level higher than the highest level of noise 44. If the outbound signal has a falling edge 46, a voltage drop 47 will occur in a high-level inbound signal, which would otherwise cause it to drop below the decision threshold. Since the delayed replica of the output data has a falling edge 48 which coincides with the falling edge 46 of the outbound signal, a pseudo-noise 49 occurs in the reference line, causing the decision threshold to drop below the lowest level of the noise 47.

Therefore, false detection of noise is avoided and the comparator 14 produces valid, error-free decision outputs.

Figure 5:
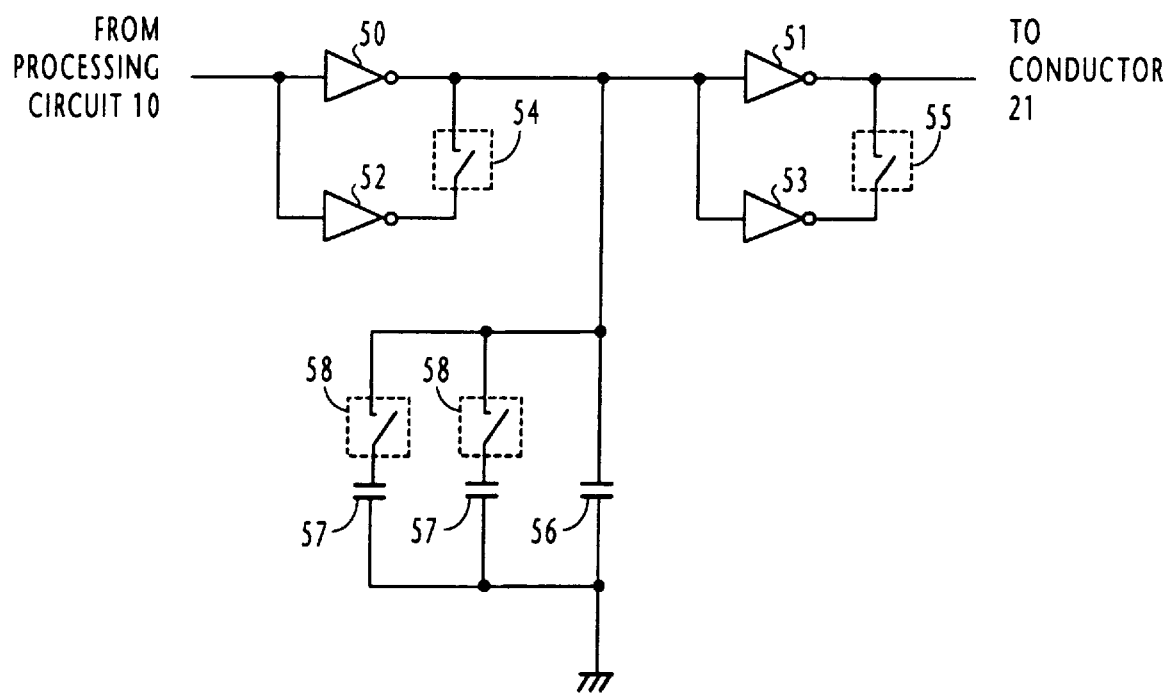
FIG. 5 is a circuit diagram of the adjustable delay circuit.

The amplitude of the pseudo-noise and the timing of its occurrence are determined by the adjustable delay circuit 30. As shown in detail in FIG. 5, the delay circuit 30 is implemented with buffer amplifiers 50 and 51 connected in series between the output of processing circuit 10 and the conductor 31. The amplitude of the pseudo-noise can be increased by increasing the output power of the delay circuit 30 by additionally connecting buffer amplifiers 52 and 53 in parallel with amplifiers 50 and 51 using manual switches 54 and 55. Switches 54 and 54 are selectively used to adjust the amplitude of the pseudo-noise so that it substantially corresponds to the amplitude of the noise inductively introduced to the inbound signal. The circuit node between parallel-connected amplifiers is connected to ground through a timing capacitor 56. The delay time can be adjusted by connecting additional capacitors 57 in parallel with the capacitor 56 using manual switches 58.

If reference potential is shared by several blocks of the integrated circuit, a global reference line is provided and local reference lines are branched out from the global line to respective circuit blocks.

Figure 6:
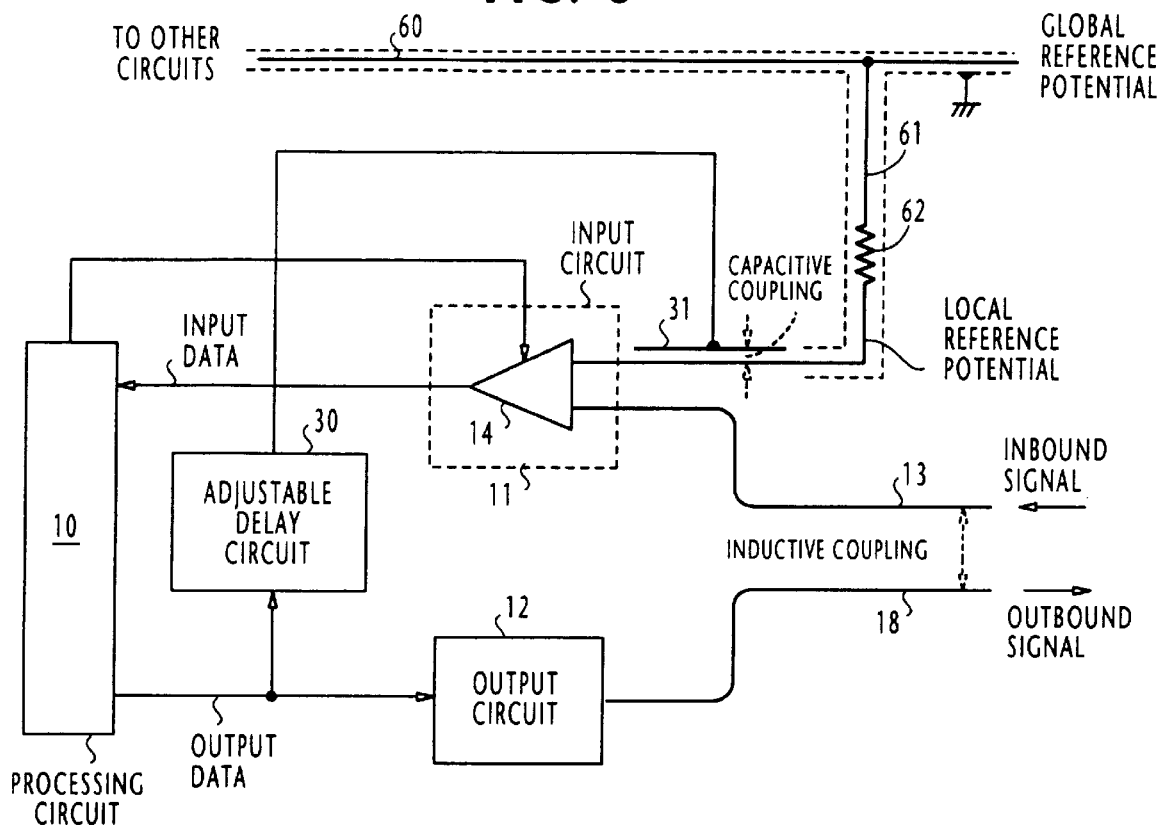
FIG. 6 is a block diagram of an electronic circuit according to one embodiment of the present invention.
Figure 7:
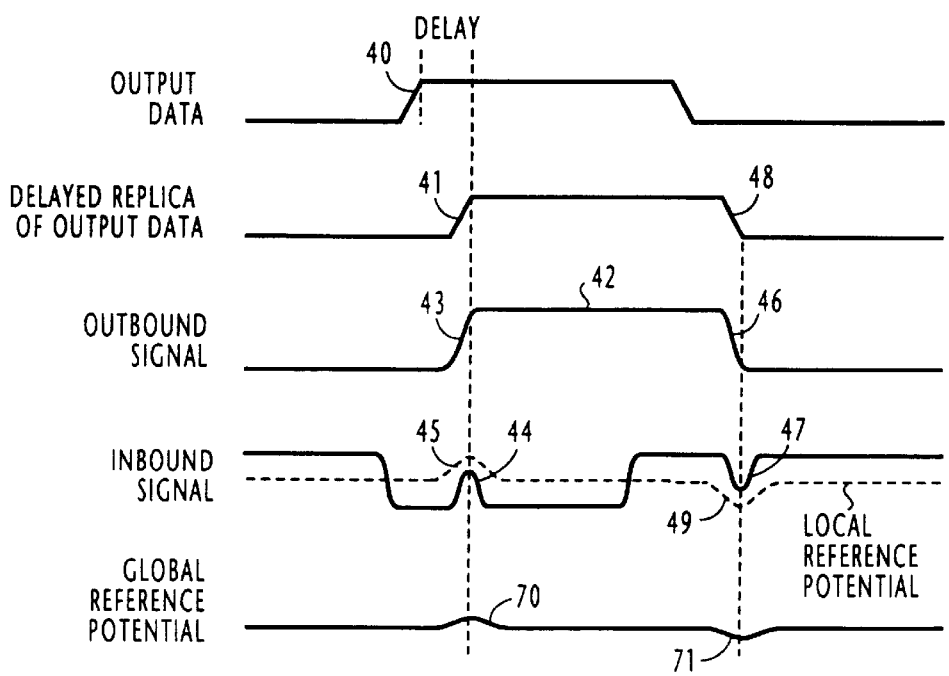
FIG. 7 is a timing diagram associated with FIG. 6.

As illustrated in FIG. 6, global reference potential is applied to the global reference line 60 from which the local reference line 61 is branched out to the comparator 14. To prevent the pseudo-noise introduced to the local reference potential from adversely affecting the reference potential supplied to other blocks of the integrated circuit, a resistor 62 is connected in the local reference line to attenuate the pseudo-noise. As shown in FIG. 7, the global reference potential varies with the pseudo-noises 45 and 47, producing attenuated voltage variations 70 and 71.

What is claimed is:

1. An electronic circuit comprising:
   an input circuit for receiving an inbound signal through an input transmission medium and comparing the inbound signal with a decision threshold to produce input data of the electronic circuit having one of predefined discrete levels depending on relative magnitudes of the inbound signal and the decision threshold;
   an output circuit for receiving output data of the electronic circuit and producing therefrom an outbound signal and forwarding the outbound signal onto an output transmission medium, said input and output transmission mediums being electromagnetically coupled together so that a noise is introduced to the received inbound signal when a voltage transition occurs in the forwarded outbound signal; and
   a noise protection circuit responsive to a voltage transition of the output data of the electronic circuit for controlling said decision threshold at timing coincident with said noise so that said input circuit makes no decision error in the presence of said noise.

2. An electronic circuit as claimed in claim 1, wherein said noise protection circuit is arranged to produce in said decision threshold a voltage variation time-coincident with said noise.

3. An electronic circuit as claimed in claim 1, wherein said noise protection circuit comprises:
   a delay circuit for producing a replica of said output data having a delayed voltage transition; and
   transient circuit means for producing said variation into said decision threshold in response to said delayed voltage transition.

4. An electronic circuit as claimed in claim 3, wherein said delay circuit includes means for adjusting time between the voltage transition of said output data received by the output circuit and said delayed voltage transition.

5. An electronic circuit as claimed in claim 3 or 4, wherein said delay circuit includes means for adjusting amplitude of said voltage variation in said decision threshold.

6. An electronic circuit as claimed in claim 3, wherein said transient circuit means comprises a conductor capacitively coupled with a conductor through which said decision threshold is applied to said input circuit.

7. An electronic circuit as claimed in claim 1, further comprising a global reference line for supplying a global decision threshold to other parts of the electronic circuit, a local reference line branched from said global reference line to said input circuit, and a resistor connected in said local reference line, so that the input circuit is supplied with a local decision threshold via said resistor.

8. A noise protection method for an electronic circuit comprising an input circuit for receiving an inbound signal through an input transmission medium and comparing the inbound signal with a decision threshold to produce input data of the electronic circuit having one of predefined discrete levels depending on relative magnitudes of the inbound signal and the decision threshold, and an output circuit for receiving output data of the electronic circuit and producing therefrom an outbound signal and forwarding the outbound signal onto an output transmission medium, said input and output transmission mediums being electromagnetically coupled together so that a noise is introduced to the received inbound signal when a voltage transition occurs in the forwarded outbound signal, the method comprising the steps of:
   a) detecting a voltage transition of the output data received by said output circuit;
   b) waiting an interval running from the detection of said voltage transition by the step (a) until an instant which coincides with said noise; and
   c) controlling said decision threshold at the end of said interval to prevent said noise in the inbound signal from crossing said decision threshold.

9. A noise protection method as claimed in claim 8, wherein the step (c) comprises introducing a pseudo-noise into said decision threshold.

10. A noise protection method as claimed in claim 9, wherein the step (c) comprises capacitively introducing said pseudo-noise into said decision threshold.

* * * * *